United States Patent
Choi et al.

(10) Patent No.: US 9,484,555 B2
(45) Date of Patent: Nov. 1, 2016

(54) ORGANIC LIGHT EMITTING DISPLAY DEVICE INCLUDING A NON-LIGHT EMITTING REGION, LIGHT EMITTING REGION AND PHOTOCHROMIC LAYER

(71) Applicant: SAMSUNG DISPLAY CO., LTD., Yongin, Gyeonggi-Do (KR)

(72) Inventors: Chung Sock Choi, Seoul (KR); Jin Koo Kang, Gwangju (KR); Soo Youn Kim, Siheung-si (KR); Seung Hun Kim, Hwaseong-si (KR); Hyun Ho Kim, Hwaseong-si (KR); Seung Yong Song, Suwon-si (KR); Cheol Jang, Uiwang-si (KR); Sang Hwan Cho, Suwon-si (KR); Sang Hyun Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 14/095,942

(22) Filed: Dec. 3, 2013

(65) Prior Publication Data
US 2015/0048316 A1    Feb. 19, 2015

(30) Foreign Application Priority Data

Aug. 14, 2013 (KR) .......... 10-2013-0096698

(51) Int. Cl.
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ....... *H01L 51/5284* (2013.01); *H01L 27/3244* (2013.01)

(58) Field of Classification Search
None
See application file for complete search history.

(56) References Cited

U.S. PATENT DOCUMENTS

| 2010/0156765 A1* | 6/2010 | Park et al. ............. 345/77 |
| 2011/0175118 A1* | 7/2011 | Hori et al. ............ 257/89 |
| 2012/0099054 A1* | 4/2012 | Takeuchi et al. ..... 349/98 |

FOREIGN PATENT DOCUMENTS

| EP | 0910865 B1 | 4/1999 |
| JP | 2000-156034 | 6/2000 |
| JP | 2003-257621 | 9/2003 |
| KR | 10-2006-0084978 | 7/2006 |
| KR | 10-2007-0109217 | 11/2007 |
| KR | 10-2007-0113412 | 11/2007 |
| KR | 10-2008-0024346 | 3/2008 |
| KR | 10-2009-0016739 | 2/2009 |
| KR | 10-2009-0055180 | 6/2009 |
| KR | 10-2010-0073654 | 7/2010 |
| KR | 10-2011-0120850 | 11/2011 |
| KR | 10-2012-0008359 | 1/2012 |
| KR | 10-2012-0043497 | 5/2012 |

\* cited by examiner

*Primary Examiner* — Mohammad Islam
*Assistant Examiner* — Jay C Chang
(74) *Attorney, Agent, or Firm* — Lewis Roca Rothgerber Christie LLP

(57) ABSTRACT

An organic light emitting display device includes a substrate having a non-light emitting region and a light emitting region, a photochromic layer in a path of light that is emitted from the light emitting region and a light blocking layer on the photochromic layer, wherein the light blocking layer comprises a plurality of light blocking patterns that are spaced from each other, the light blocking patterns overlap the light emitting region, and a space between adjacent light blocking patterns exposes the non-light emitting region.

19 Claims, 12 Drawing Sheets

ORGANIC LIGHT EMITTING DISPLAY DEVICE INCLUDING A NON-LIGHT EMITTING REGION, LIGHT EMITTING REGION AND PHOTOCHROMIC LAYER

CROSS-REFERENCE TO RELATED APPLICATION

This application claims priority to and the benefit of Korean Patent Application No. 10-2013-0096698 filed on Aug. 14, 2013 in the Korean Intellectual Property Office, the disclosure of which is incorporated herein in its entirety by reference.

BACKGROUND

1. Field

The present invention relates to a display device, and more particularly to an organic light emitting display device.

2. Description of the Related Art

Unlike a liquid crystal display (LCD), an organic light emitting display device is self-luminescent without the necessity of a separate light source, and thus its thickness and weight can be reduced. Further, the organic light emitting display device has the advantages of wide viewing angle, low power consumption, high luminance, and high response speed, and has been actively developed as the next-generation display device.

The organic light emitting display device includes thin-film transistors and organic light emitting elements, and an electrode included therein may reflect light that is incident from outside the organic light emitting display device (e.g., external light) to the organic light emitting display device at a high rate (e.g., without substantially dimming). The reflected external light may be recognized by a user together with light that is emitted from the organic light emitting display device, and thus, screen visibility of the organic light emitting display device may deteriorate.

SUMMARY

In order to prevent the visibility deterioration due to the reflection of an external light, a circular polarizer or a photochromic (Ph) layer may be arranged on an upper portion of the organic light emitting display device as an external light reflection prevention member. However, due to the arrangement of the external light reflection prevention member, light that is emitted from the organic light emitting display device may be absorbed by or in the external light reflection prevention member, and thus the light emitting efficiency of the organic light emitting display device may deteriorate.

Accordingly, an aspect of the present invention provides an organic light emitting display device which can prevent deterioration of the light emitting efficiency while reducing (e.g., minimizing) the external light reflection of a screen.

Another aspect of the present invention provides an organic light emitting display device which can improve the display quality by or through prevention of deterioration of the light emitting efficiency while lowering (e.g., minimizing) the external light reflection of a screen.

Additional aspects and/or characteristics of the invention will be set forth in part in the description which follows and in part will become apparent to those having ordinary skill in the art upon examination of the following or may be learned from practice of the invention.

According to an embodiment of the present invention, there is provided an organic light emitting display device including a substrate having a non-light emitting region and a light emitting region, a photochromic layer in a path of light that is emitted from the light emitting region and a light blocking layer on the photochromic layer, wherein the light blocking layer includes a plurality of light blocking patterns that are spaced from each other, the light blocking patterns overlap the light emitting region, and a space between adjacent light blocking patterns exposes the non-light emitting region.

The photochromic layer may include photochromic particles, and the light blocking layer may be configured to absorb or reflect ultraviolet rays.

The photochromic layer may include a first photochromic layer that overlaps the light emitting region and a second photochromic layer that overlaps the non-light emitting region, and the first photochromic layer may be thinner than the second photochromic layer.

A reflection prevention layer may be on the light blocking layer.

A semi-permeation film may be on the light blocking layer.

The semi-permeation film may include photochromic particles.

A sensor may be configured to detect a degree of color change of the photochromic layer.

An encapsulation member may be on the light blocking layer.

An encapsulation member may be between the substrate and the photochromic layer.

According to another embodiment of the present invention, there is provided an organic light emitting display device including a substrate having a non-light emitting region and a light emitting region, a photochromic layer in a path of light that is emitted from the light emitting region and a light blocking layer on the photochromic layer, wherein the light blocking layer includes a first light blocking layer that overlaps the light emitting region and a second light blocking layer that overlaps the non-light emitting region, and the first light blocking layer is thicker than the second light blocking layer.

The light blocking layer may include a plurality of light blocking patterns that are spaced from each other, the light blocking patterns may overlap the light emitting region, and a space between adjacent light blocking patterns may expose the non-light emitting region.

The photochromic layer may include photochromic particles, and the light blocking layer may be configured to absorb or reflect ultraviolet rays.

The photochromic layer may include a first photochromic layer that overlaps the light emitting region and a second photochromic layer that overlaps the non-light emitting region, and the first photochromic layer may be thinner than the second photochromic layer.

A reflection prevention layer may be on the light blocking layer.

A semi-permeation film may be on the light blocking layer.

According to another embodiment of the present invention, there is provided an organic light emitting display device including a substrate having a non-light emitting region and a fight emitting region, a photochromic layer in a path of light that is emitted from the light emitting region and a light blocking layer on the photochromic layer, wherein the photochromic layer includes a first photochromic layer that overlaps the light emitting region and a second photochromic layer that overlaps the non-light emitting region, and the light blocking layer has openings exposing an upper portion of the second photochromic layer.

The photochromic layer may include photochromic particles, and the light blocking layer may be configured to absorb or reflect ultraviolet rays.

The light blocking layer may include a first light blocking layer that overlaps the light emitting region and a second light blocking layer that overlaps the non-light emitting region, and the second light blocking layer may be thinner than the first light blocking layer.

The photochromic layer may include the first photochromic layer that overlaps the light emitting region and the second photochromic layer that overlaps the non-light emitting region, and the first photochromic layer may be thinner than the second photochromic layer.

A reflection prevention layer may be on the light blocking layer.

A semi-permeation film may be on the light blocking layer.

BRIEF DESCRIPTION OF THE DRAWINGS

The above and other features and aspects of the present invention will be more apparent from the following detailed description taken in conjunction with the accompanying drawings, in which.

DETAILED DESCRIPTION

Figure 1:
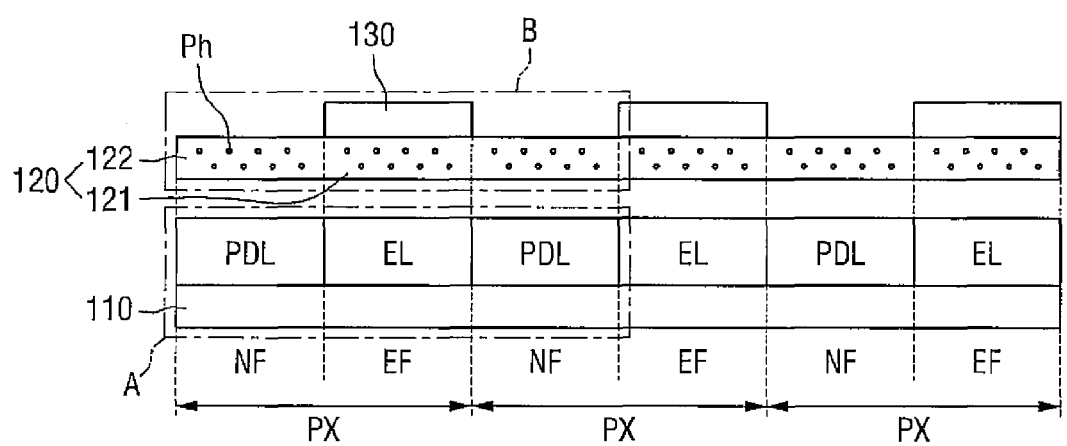
FIG. 1 is a cross-sectional view of an organic light emitting display device according to an embodiment of the present invention.

Aspects and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will be defined by the appended claims and their equivalents. Thus, in some embodiments, well-known structures and devices may not be shown in order not to obscure the description of the invention with unnecessary detail. Like numbers refer to like elements throughout. In the drawings, the thickness of layers and regions are exaggerated for clarity.

It will be understood that when an element or layer is referred to as being "on" or "connected to" another element or layer, it may be directly on or connected to the other element or layer or intervening elements or layers may be present. When an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component, or a first section discussed below could be termed a second element, a second component, or a second section without departing from the teachings of the present invention. Further, the use of "may" when describing embodiments of the present invention refers to "one or more embodiments of the present invention."

Hereinafter, embodiments of the present invention will be described with reference to the accompanying drawings.

Figure 2:
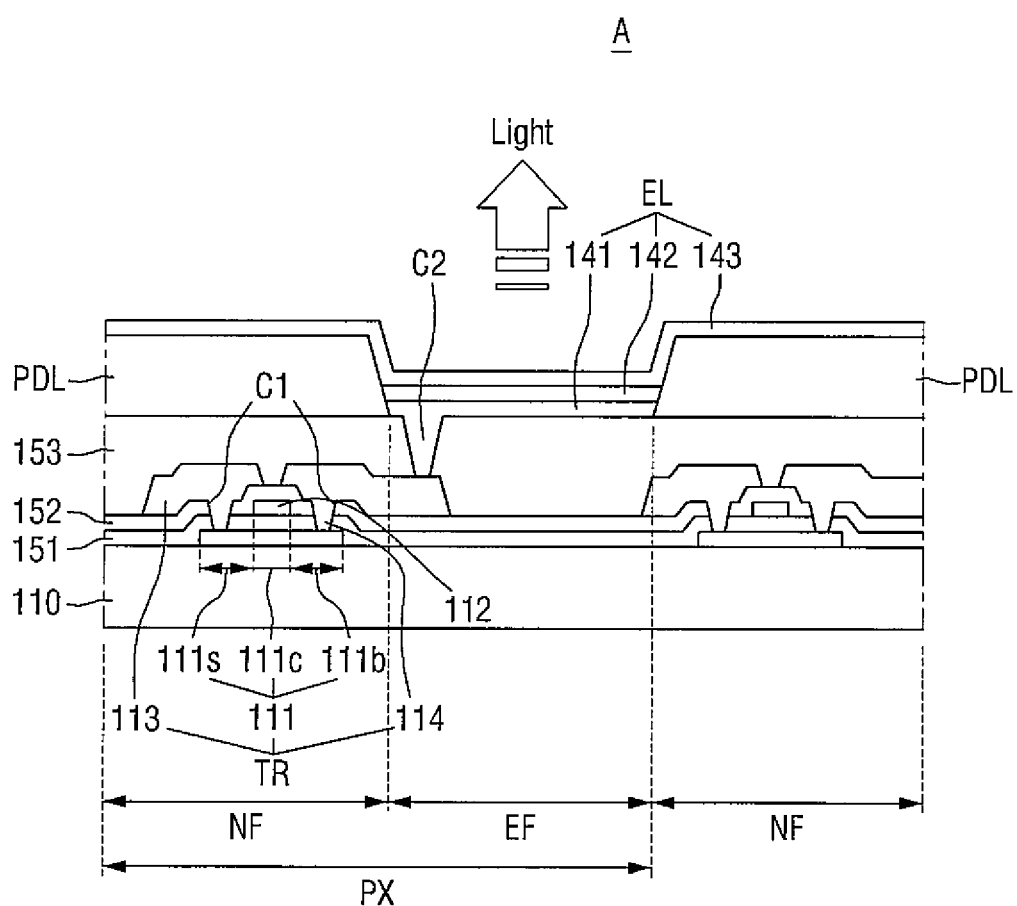
FIG. 2 is an enlarged cross-sectional view of the region A in FIG. 1.

FIG. 1 is a cross-sectional view of an organic light emitting display device according to an embodiment of the present invention, and FIG. 2 is an enlarged cross-sectional view of the region A in FIG. 1.

Referring to FIG. 1, an organic light emitting display device 10 includes a substrate 110, a photochromic layer 120, and a light blocking layer 130.

The substrate 110 may be formed of an insulating material. For example, the substrate 110 may be formed of glass, quartz, ceramic, or plastic. In some embodiments, the substrate 110 may be formed of a material that is easily bent by an external force. Further, if the organic light emitting display device 10 is of a bottom-emission type, which emits (e.g., implements) an image towards the substrate 110, the substrate 110 may be formed of a transparent material. In some embodiments, the substrate 110 may further include a buffer layer (not illustrated) formed on the substrate 110 to prevent diffusion of impurity ions, to prevent permeation of moisture or outside air, and to planarize the surface of the substrate 110. The substrate 110 may include a plurality of pixels PX. Each pixel PX may include a non-light emitting region NF and a light emitting region EF. That is, the substrate 110 may include a plurality of non-light emitting regions NF and a plurality of light emitting regions EF, and the light emitting regions EF may be alternately arranged between the non-light emitting regions NF. The light emitting region EF may correspond to a region (e.g., may be a region) in which an organic light emitting element EL is formed and light is emitted from the organic light emitting element EL, and the non-light emitting region NF may correspond to a region (e.g., may be a region) in which a thin-film transistor TR that drives the organic light emitting element EL, a signal line, such as a gate line or a data line, or a pixel-defining film is formed.

Referring to FIG. 2, the substrate 110 may include a thin-film transistor TR that is arranged between an organic light emitting layer 142 and the non-light emitting region NF. The thin-film transistor TR may include a semiconductor layer 111, a gate electrode 112, a source electrode 113, and a drain electrode 114, and the organic light emitting element EL may include a first electrode 141, an organic light emitting layer 142, and a second electrode 143.

The semiconductor layer 111 may be arranged on the non-light emitting region NF. The semiconductor layer 111 may be formed of amorphous silicon or poly silicon. The semiconductor layer 111 may include a channel region 111c, a source region 111s, and a drain region 111d. The channel region 111c may be arranged between the source region 111s and the drain region 111d. The channel region 111c may be arranged to overlap the gate electrode 112. The channel region 111c has conductivity according to a voltage that is applied to the gate electrode 112, and may connect (e.g., electrically connect) the source region ills and the drain region 111d to each other, or may block (e.g., electrically block) the source region 111s and the drain region 111d from each other. A first insulating layer 151 may be formed on the semiconductor layer 111. The first insulating layer 151 may be formed of an inorganic material, for example, SiNx or SiOx, but is not limited thereto. In some embodiments, the first insulating layer 151 may be formed of an organic material.

The gate electrode 112 may be arranged on the first insulating layer 151 to be isolated (e.g., electrically isolated) from the semiconductor layer 111, and may be arranged to correspond to (e.g., overlap) the channel region 111c. The gate electrode 112 may be formed of a conductive material. The conductive material for forming the gate electrode 112 may include, for example, a transparent conductive material such as indium tin oxide (ITO), titanium (Ti), molybdenum (Mo), aluminum (Al), silver (Ag), copper (Cu), or an alloy thereof, but is not limited thereto. Using (e.g., by) a voltage that is applied to the gate electrode 112, activation of the channel region 111c may be controlled, and thus a state (e.g., turn-on and turn-off) of the thin-film transistor TR may be controlled.

A second insulating layer 152 may be formed on the gate electrode 112. The second insulating layer 152 may be formed of the same inorganic or organic material as that of the first insulating layer 151.

The source electrode 113 and the drain electrode 114 may be arranged on the second insulating layer 152. The source electrode 113 and the drain electrode 114 may respectively come in contact with the source region 111s and the drain region 111d through a first contact hole C1. If the channel region 111c is activated, current may flow from the source electrode 113 to the drain electrode 114, and the drain electrode 114 may make the current flow to the first electrode 141 and the organic light emitting layer 142 through a second contact hole C2. A third insulating layer 153, which is made of the same inorganic or organic material as that of the first insulating layer 151, may be formed on the source electrode 113 and the drain electrode 114 to insulate and protect the source electrode 113 and the drain electrode 114.

The first electrode 141 may be formed on the light emitting region EF of the substrate 110, and the organic light emitting layer 142 may be formed on the first electrode 141. The light emitting region EF may be substantially defined by a width of the corresponding organic light emitting layer 142.

The second electrode 143 may be formed on the organic light emitting layer 142 and the substrate 110. The first electrode 141, the organic light emitting layer 142, and the second electrode 143 may constitute the organic light emitting element EL.

The first electrode 141 may be formed on the third insulating layer 153. The first electrode 141 may be connected to the drain electrode 114 of the thin-film transistor TR through the second contact hole C2. The first electrode 141 may be an anode electrode of the organic light emitting element EL. The first electrode 141 may be formed of a reflective conductive material, a transparent conductive material, or a semitransparent conductive material. For example, as the reflective conductive material, lithium (Li), calcium (Ca), lithium fluoride/calcium (LiF/Ca), lithium fluoride/aluminum (LiF/Al), aluminum (Al), silver (Ag), magnesium (Mg), or gold (Au) may be used. As the transparent conductive material, ITO (Indium Tin Oxide), IZO (ITO Zinc Oxide), ZnO (Zink Oxide), or $In_2O_3$(Indium Oxide) may be used, and as the semitransparent conductive material, a vacuum-deposited material including one or more of magnesium (Mg) and silver (Ag), or one or more of magnesium (Mg), silver (Ag), calcium (Ca), lithium (Li), and aluminum (Al) may be used.

The organic light emitting layer 142 may be arranged on the first electrode 141. The organic light emitting layer 142 may emit light with a brightness that corresponds to the current flowing through the organic light emitting layer 142. More specifically, if holes and electrons are provided to the organic light emitting layer 142, the holes and the electrons may be mutually combined to form excitons. The energy level of the excitons may be changed from an excited state to a ground state, and at this time, light that corresponds to the changed energy level may be emitted. Each organic light emitting layer 142 may emit light of one color, and the organic light emitting layer 142 may emit light of red (R), green (G), or blue (B) depending on the organic material that forms the organic light emitting layer 142.

The second electrode 143 may be arranged on the organic light emitting layer 142. The second electrode 143 may be a cathode electrode of the organic light emitting element EL. The second electrode 143 may be formed of one or more materials of magnesium (Mg), silver (Ag), calcium (Ca), lithium (Li), and aluminum (Al) with a thin thickness, and may emit the light that is generated from the organic light emitting layer 142 to an upper portion of the organic light emitting element EL.

The organic light emitting display device 10 may further include a pixel-defining film PDL. The pixel-defining film PDL may be arranged between the organic light emitting layers 142. The pixel-defining film PDL may be formed of the same organic or inorganic material as that of the first insulating layer 151, and may be formed on the third insulating layer 153 at an area corresponding to the non-light emitting region NF to substantially define the light emitting region EF.

Referring again to FIG. 1, the photochromic layer 120 may be formed in (e.g., formed on) a path of the light that is emitted from the light emitting region EF. As illustrated in FIG. 1, in the case of a top-emission organic light emitting display device 10, the propagation path of the light is in an upward direction of the light emitting region EF, and thus the photochromic layer 120 may be formed on an upper portion of the light emitting region EF. However, the present invention is not limited thereto. In the case of a bottom-emission organic light emitting display device 10, the propagation path of the light is in a downward direction of the light emitting region EF, and thus the photochromic layer 120 may be formed on a lower portion of the light emitting region EF. The photochromic layer 120 may be arranged on an upper portion of the substrate 110 and spaced (e.g., spaced apart) from the substrate 110. However, the present invention is not limited thereto. In some embodiments, the photochromic layer 120 may be formed on the substrate 110.

The photochromic layer 120 may serve as an encapsulation member that protects the thin-film transistor TR and the organic light emitting layer 142 formed on the substrate 110. That is, the photochromic layer 120 may protect the elements arranged on the lower portion thereof against an external physical impact or permeation of external foreign substances.

The photochromic layer 120 may be transparent with respect to a visible light, but its color is changed if a non-visible light, for example, ultraviolet rays, is irradiated thereon.

External light may include not only typical visible light but also ultraviolet rays. Accordingly, if external light that includes the ultraviolet rays is irradiated on the photochromic layer 120, the color of the photochromic layer 120 may be changed. The color-changed photochromic layer 120 may at least partly absorb the visible light included in the external light, and may reduce (e.g., prevent or minimize) an inflow of the external visible light to the organic light emitting display device 10. That is, the color-changed photochromic layer 120 can reduce (e.g., minimize) reflection of the external light and prevent the visibility of the organic light emitting display device from deteriorating. Further, if the ultraviolet rays are not or cease to be irradiated thereon, the photochromic layer 120 can return to a transparent state (e.g., become transparent with respect to the visible light). That is, because the photochromic layer 120 selectively exhibits reversible color-change properties depending on whether or not the external light is irradiated thereon, the external light reflection can be effectively reduced (e.g., minimized), and the light emitting efficiency of the organic light emitting display device can be prevented from deteriorating.

In order to exhibit the above-described properties, the photochromic layer 120 may include photochromic particles Ph that correspond to a raw material of (e.g., a raw material capable of) ultraviolet (UV) color change. The photochromic particles Ph may be uniformly dispersed to the photochromic layer 120, or may be dispersed with different densities by region. For example, the photochromic particles Ph may be dispersed to a first photochromic layer 121 that corresponds to (e.g., overlaps) the light emitting region EF at a low density, and may be dispersed to a second photochromic layer 122 that corresponds to (e.g., overlaps) the non-light emitting region NF at a high density.

The photochromic material Ph may be an inorganic or organic material. Here, the inorganic material may be a halide, for example, a zinc halide, a cadmium halide, a copper halide, or a magnesium halide, and the organic material may be a spiropyran, a spironaphthoxazine dye, a diarylethene derivative, a dihydropyridine, a furylfulgide derivative, or an azobenzene derivative, but the inorganic material and the organic material are not limited thereto. Further, the material that may be included in the photochromic layer 120 is not limited to the photochromic particles Ph, but may include particles of which the color may be changed corresponding to the incidence of external light including infrared rays (IR), X-rays, gamma rays, or microwaves, and the color-changed particles may absorb the external light to reduce (e.g., minimize) the external light reflection.

The light blocking layer 130 may be formed on the photochromic layer 120. The light blocking layer 130 may include a plurality of light blocking patterns that are spaced (e.g., spaced apart) from each other. Each light blocking pattern may correspond to (e.g., overlap) the light emitting region EF. That is, the light blocking pattern may be in a matrix form. The non-light emitting region NF neighboring the light emitting region EF may be exposed (e.g., not covered by the light blocking pattern). That is, the light blocking layer 130 may be formed only on the first photochromic layer 121 that corresponds to (e.g., overlaps) the light emitting region EF. FIG. 1 illustrates that cross-sectional areas of the light blocking layer 130 and the light emitting region EF are equal to each other, but the light blocking layer 130 and the light emitting region EF are not limited thereto. In some embodiments, the cross-sectional area of the light blocking layer 130 may be larger than the cross-sectional area of the light emitting region EF. In some other embodiments, the cross-sectional area of the light blocking layer 130 may be smaller than the cross-sectional area of the light emitting region EF.

Because the light blocking layer 130 is formed in the light propagation path, it may be formed of a transparent material. The light blocking layer 130 partially or completely blocks the external light, and thus can prevent the thin-film transistor TR or the organic light emitting layer 142 formed on the substrate 110 from being damaged due to the external light. Further, the light blocking layer 130 may control the degree of color change of the photochromic layer 120 by adjustment of the external light quantity that is irradiated onto the photochromic layer 120. Hereinafter, the above-described features will be described in more detail with reference to FIGS. 3 and 4.

Figure 3:
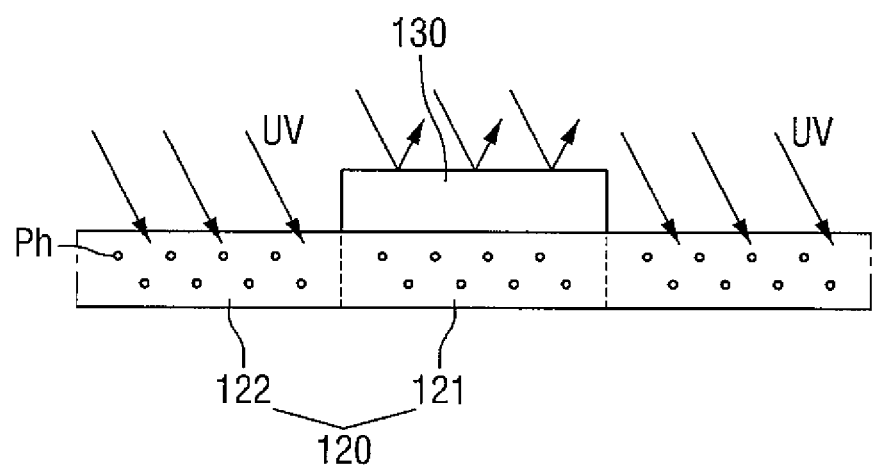
FIG. 3 is an enlarged cross-sectional view of the region B in FIG. 1.
Figure 4:
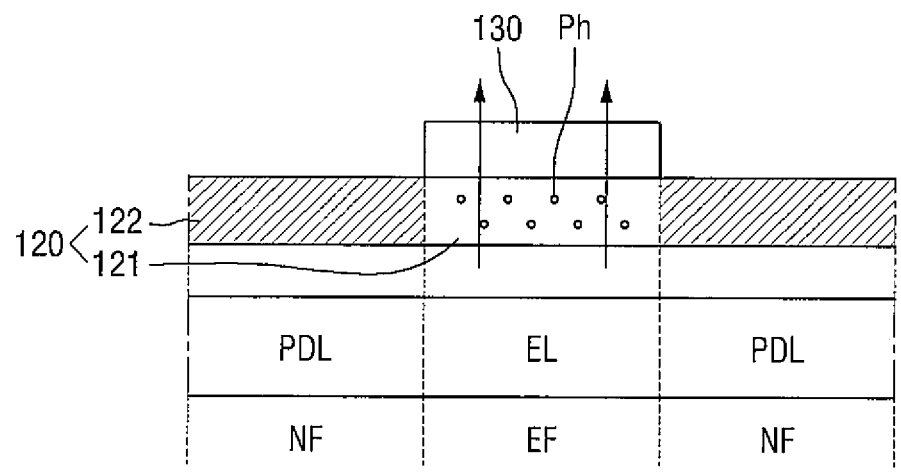
FIG. 4 is an enlarged cross-sectional view of the region B in FIG. 1 after irradiation of ultraviolet rays thereon.

FIG. 3 is an enlarged cross-sectional view of the region B in FIG. 1, and FIG. 4 is an enlarged cross-sectional view of the region B in FIG. 1 after irradiation of ultraviolet rays thereon.

Referring to FIGS. 3 and 4, the light blocking layer 130 may partially or completely block the external light by absorption or reflection of the external light. As described above, the external light may be non-visible light, but is not limited thereto. The light blocking layer 130 may completely or partially block the non-visible light, such as infrared rays (IR), X-rays, gamma rays, or microwaves. Accordingly, the external light may not be incident to (e.g., irradiated on) the first photochromic layer 121 that is arranged on the lower portion of the light blocking layer 130. However, in a region where the light blocking layer 130 is not formed, the external light may not be blocked and may be incident to (e.g., irradiated on) the second photochromic layer 122. That is, the external light may be individually incident (e.g., discriminatingly incident) to the photochromic layer 120 by the light blocking layer 130, and thus the color of the second photochromic layer 122 is changed, but the color of the first photochromic layer 121 is not changed or the degree of the color change of the first photochromic layer 121 may be reduced (e.g., minimized). The color-changed second photochromic layer 122 can absorb the external light to reduce (e.g., minimize) the external light reflection. Further, the light emitted from the organic light emitting element EL can pass through the first photochromic layer 121, of which the color is not changed, without a light loss. Accordingly, the organic light emitting display device 10 according to an embodiment of the present invention can reduce or prevent the deterioration of the light emitting efficiency due to the arrangement of the external light reflection prevention member while reducing (e.g., minimizing) the external light reflection, and thus the screen visibility can be improved.

In some embodiments, the organic light emitting display device 10 may further include a separate encapsulation substrate that encapsulates the substrate 110. The encapsulation substrate may prevent the permeation of external materials into the element and may prevent the element from being damaged due to external physical force. The encapsulation substrate may be a glass substrate or a thin-film encapsulation (TFE). The encapsulation substrate may be formed on the light blocking layer 130, but is not limited thereto. The encapsulation substrate may be arranged between the photochromic layer 120 and the substrate 110.

Further, in some embodiments, the organic light emitting display device 10 may further include a sensor that detects (e.g., senses) the degree of the color change of the photochromic layer 120. The sensor (not illustrated) may be arranged between sealants, which correspond to overlapping portions between the substrate 110 and the encapsulation substrate, or pixels PX. The sensor may detect the degree of the color change of the photochromic layer 120 by detection of the external light quantity that permeates the photochromic layer 120. The sensor may output a voltage signal and/or a current signal that correspond to the sensed degree of the color change of the photochromic layer 120 to control the light emitting intensity of the corresponding organic light emitting element EL.

Hereinafter, another embodiment of the present invention will be described. In the following embodiment, the same reference numerals are used for the same elements and configurations as the elements and configurations as described above, and the duplicate explanation thereof will be omitted or simplified.

Figure 5:
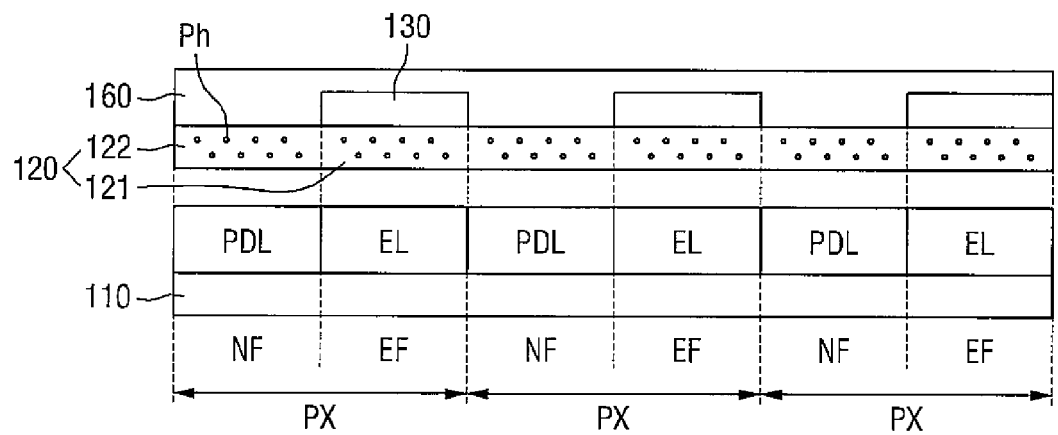
FIG. 5 is a cross-sectional view of an organic light emitting display device according to another embodiment of the present invention.

FIG. 5 is a cross-sectional view of an organic light emitting display device according to another embodiment of the present invention. An organic light emitting display device 11, according to this embodiment, may further include a reflection prevention layer 160 that is formed on the light blocking layer 130. The reflection prevention layer 160 may be a single-layer film having a refraction index that is different from the refraction index of the light blocking layer 130, and may be formed of polyethylene terephthalate (PET), triacetylcellulose (TAC), or polyvinyl alcohol (PVA), but is not limited thereto. In some embodiments, the reflection prevention layer 160 may have a multilayer structure in which low-refraction and high-refraction materials are alternately layered (e.g., laminated). The reflection prevention layer 160 may completely or partially block the inflow of the external light into the organic light emitting display device 11 by changing the phase of the external light. That is, even in the case where the color change of the photochromic layer 120 does not occur, such as because the external light is not strong, the reflection prevention layer 160 may reduce (e.g., minimize) the external light reflection by completely or partially blocking the inflow of the external light. Accordingly, the organic light emitting display device 11 according to this embodiment can effectively reduce (e.g., minimize) the external light reflection and provide an improved screen visibility.

Hereinafter, still another embodiment of the present invention will be described. In the following embodiment, the same reference numerals are used for the same elements and configurations as the elements and configurations as described above, and the duplicate explanation thereof will be omitted or simplified.

Figure 6:
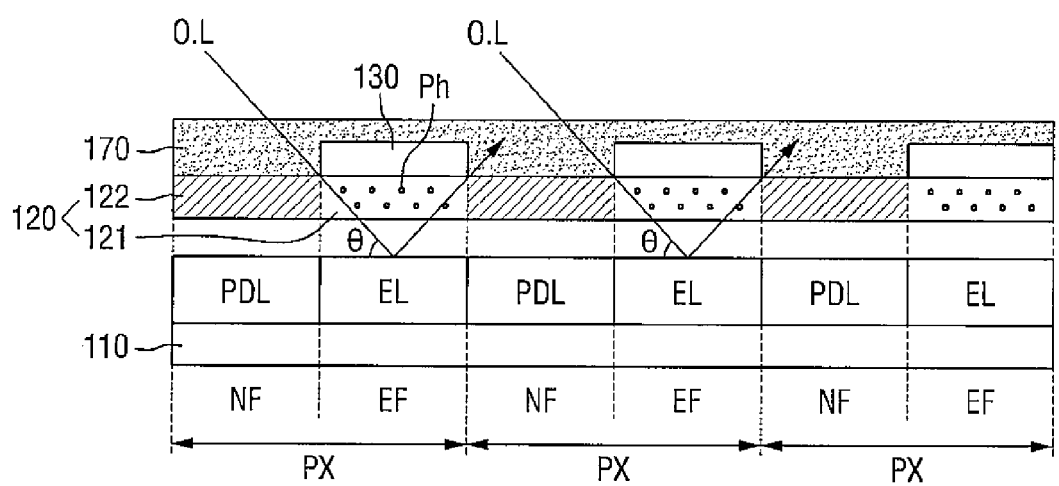
FIG. 6 is a cross-sectional view of an organic light emitting display device according to still another embodiment of the present invention.

FIG. 6 is a cross-sectional view of an organic light emitting display device according to still another embodiment of the present invention. Referring to FIG. 6, an organic light emitting display device 12 may further include a semi-permeation film 170 that is formed on the light blocking layer 130. The semi-permeation film 170 may be formed from a colloid including silver (Ag), gold (Au), or titanium (Ti), and may be formed using a heat treatment process after being deposited (e.g., spread) by spin coating, deep coating, or bar coating. At least a part of the light that is incident to the semi-permeation film 170 may be absorbed by or in the semi-permeation film 170, and the remaining part of the light may pass through the semi-permeation film 170. That is, even in the case where the color change of the photochromic layer 120 does not occur, such as because the external light is not strong, the semi-permeation film 170 may reduce the external light reflection by effective absorption of the external light at a constant ratio. The ratio of the external light that is absorbed in the semi-permeation film 170 may be determined according to the light permeability of the semi-permeation film 170. The light permeability of the semi-permeation film 170 may be 40 to 80%, and the light permeability may be controlled by adjusting the thickness of the semi-permeation film 170 or the amount of one or more materials used during a semi-permeation film manufacturing process.

Further, the semi-permeation film 170 can effectively reduce the external light reflection by absorption of the external light OL that is not absorbed by the photochromic layer 120. As illustrated in FIG. 6, the external light OL may be incident at an angle θ (e.g., a predetermined angle) to the organic light emitting element EL so that the external light OL passes through the first photochromic layer 121 while not being absorbed by or in the color-changed second photochromic layer 122. The external light OL may be incident to the organic light emitting display device 12 after passing through the first photochromic layer 121, may be reflected from the organic light emitting element EL, and may be emitted to an outside of the organic light emitting display device 12 after passing through the first photochromic layer 121 again. Because the semi-permeation film 170 may absorb a part of the incident external light OL and a part of the emitted external light OL, the external light reflection that may be caused by the incident external light OL may be reduced (e.g., minimized). Accordingly, the organic light emitting display device 12 according to this embodiment can effectively reduce (e.g., minimize) the external light reflection and provide an improved screen visibility.

In some embodiments, the semi-permeation film 170 may include photochromic particles Ph. Because the photochromic particles Ph can reduce the external light reflection by absorption of the external light, the light permeability of the semi-permeation film 170 may be adjusted according to the number of photochromic particles Ph. If the light permeability of the semi-permeation film 170 is too low, the light emitted from the organic light emitting display device 12 may be diminished, and thus the number of photochromic particles Ph included in the semi-permeation film 170 may be smaller than the number of photochromic particles Ph included in the photochromic layer 120.

Hereinafter, still another embodiment of the present invention will be described. In the following embodiment, the same reference numerals are used for the same elements and configurations as the elements and configurations described above, and the duplicate explanation thereof may be omitted or simplified.

Figure 7:
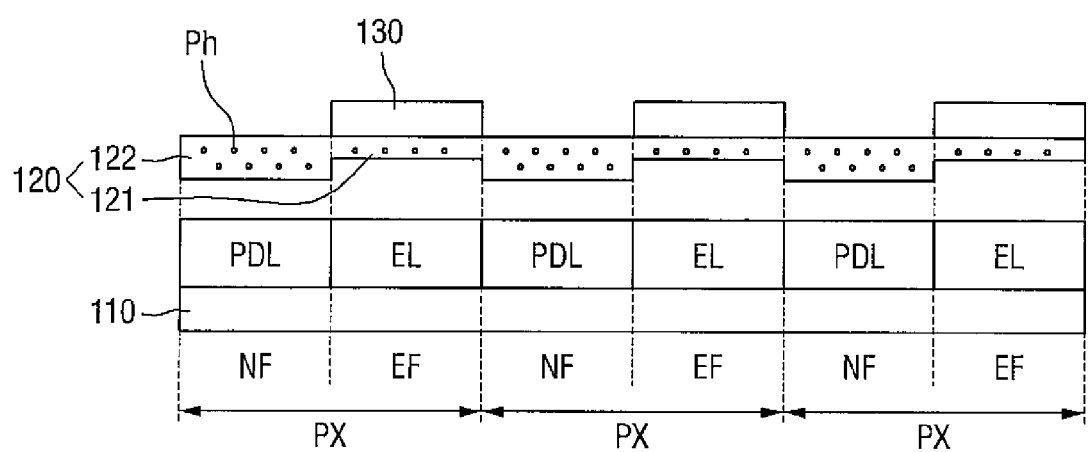
FIG. 7 is a cross-sectional view of an organic light emitting display device according to still another embodiment of the present invention.

FIG. 7 is a cross-sectional view of an organic light emitting display device according to still another embodiment of the present invention. Referring to FIG. 7, a first photochromic layer 121 of an organic light emitting display device 13 may be thinner than a second photochromic layer 122. Accordingly, light that is emitted from the organic light emitting element EL can more easily pass through the first photochromic layer 121, and thus a loss of the light quantity that may occur when the emitted light passes through the first photochromic layer 121 can be reduced (e.g., minimized). Accordingly, the organic light emitting display device 13 according to this embodiment can reduce (e.g., minimize) the reduction of the light emitting efficiency due to the arrangement of the photochromic layer 120.

Figure 8:
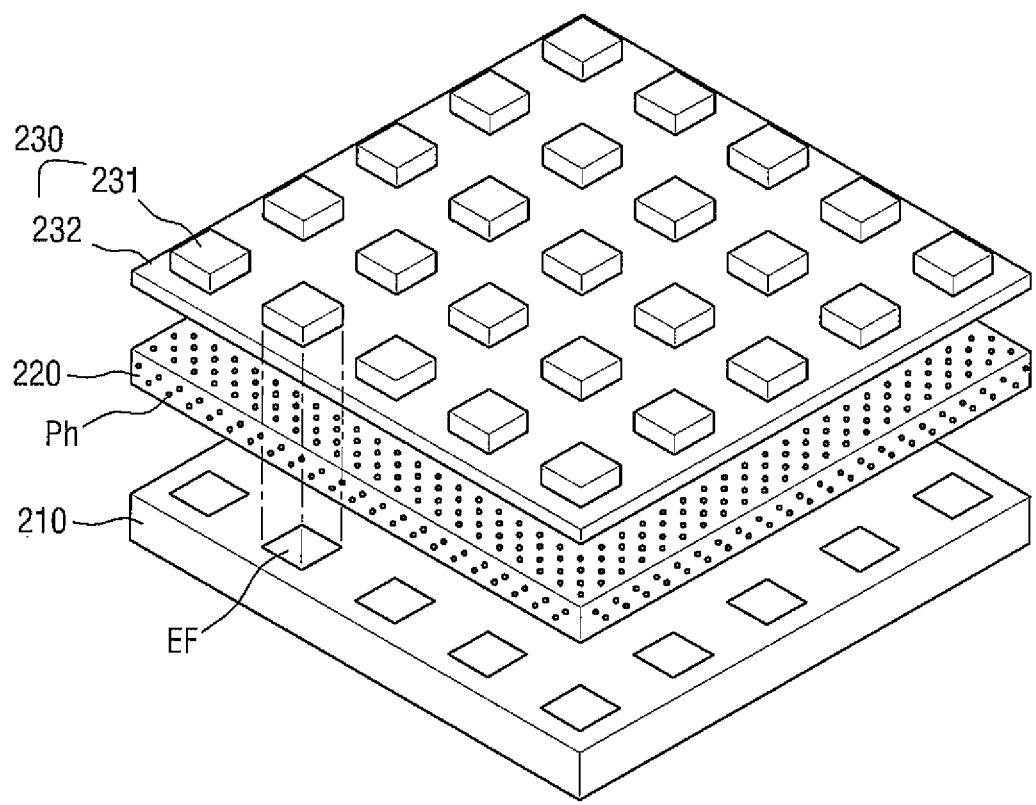
FIG. 8 is an exploded perspective view of an organic light emitting display device according to still another embodiment of the present invention.

Hereinafter, still another embodiment of the present invention will be described. FIG. 8 is an exploded perspective view of an organic light emitting display device according to still another embodiment of the present invention, and FIG. 9 is a cross-sectional view of an organic light emitting display device according to still another embodiment of the present invention.

Figure 9:
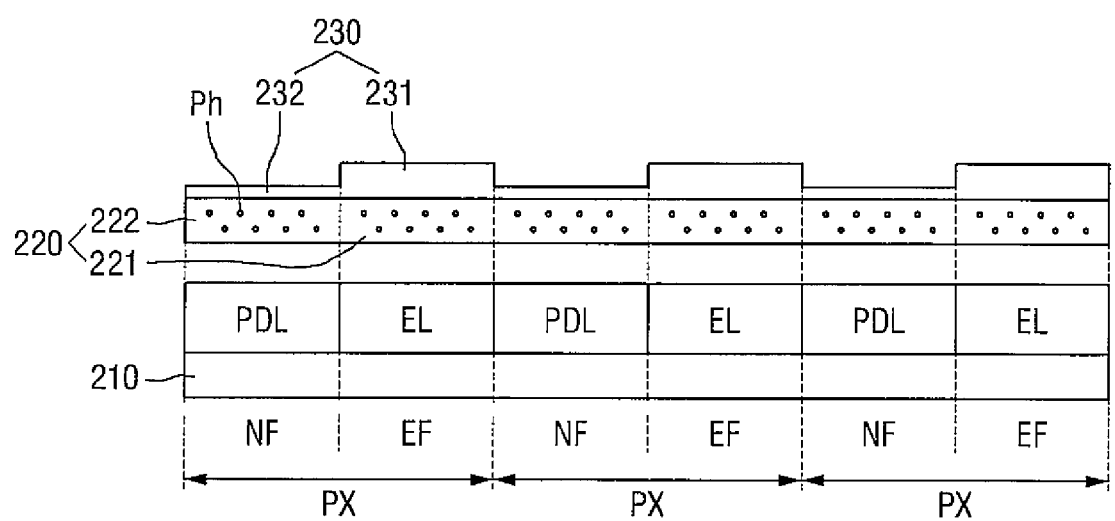
FIG. 9 is a cross-sectional view of an organic light emitting display device according to still another embodiment of the present invention.

Referring to FIGS. 8 and 9, an organic light emitting display device 20 includes a substrate 210, a photochromic layer 220, and a light blocking layer 230.

The substrate 210 may be formed of an insulating material. For example, the substrate 210 may be formed of glass, quartz, ceramic, or plastic. In some embodiments, the substrate 210 may be formed of a material that is easily bent by an external force. The substrate 210 may include a plurality of pixels PX. Each pixel PX may include a non-light emitting region NF and a light emitting region EF. That is, the substrate 210 may include a plurality of non-light emitting regions NF and a plurality of light emitting regions EF, and the light emitting regions EF may be alternately arranged between the non-light emitting regions NF. Here, the light emitting region EF may correspond to a region in which an organic light emitting element EL is formed and light is emitted from the organic light emitting element EL. The non-light emitting region NF may correspond to a region in which a thin-film transistor TR that drives the organic light emitting element EL, a signal line, such as a gate line or a data line, or a pixel-defining film is formed.

The photochromic layer 220 may be formed in a path of the light that is emitted from the light emitting region EF. The photochromic layer 220 may be transparent with respect to a visible light, but its color is changed if a non-visible light, for example, ultraviolet rays, is irradiated thereon.

External light may include not only typical visible light but also ultraviolet rays. Accordingly, if external light that includes the ultraviolet rays is irradiated on the photochromic layer 220, the color of the photochromic layer 220 may be changed. The color-changed photochromic layer 220 may at least partly absorb the visible light included in the external light, and may reduce (e.g., prevent or minimize) an inflow of the external visible light to the organic light emitting display device 20. That is, the color-changed photochromic layer 220 can reduce (e.g., minimize) reflection of the external light and prevent the visibility of the organic light emitting display device from deteriorating. Further, if the ultraviolet rays are not or cease to be irradiated thereon, the photochromic layer 220 can return to a transparent state (e.g., can became transparent with respect to the visible light). That is, because the photochromic layer 220 selectively exhibits reversible color-change properties depending on whether or not the external light is irradiated thereon, the external light reflection can be effectively reduced (e.g., minimized), and the light emitting efficiency can be prevented from deteriorating.

In order to exhibit the above-described properties, the photochromic layer 220 may include photochromic particles Ph that correspond to a raw material of (e.g., a raw material capable of) ultraviolet (UV) color change. The photochromic particles Ph may be uniformly dispersed to the photochromic layer 220, or may be dispersed with different densities by region. For example, the photochromic particles Ph may be dispersed to a first photochromic layer 221 that corresponds to (e.g., overlaps) the light emitting region EF at a low density, and may be dispersed to a second photochromic layer 222 that corresponds to (e.g., overlaps) the non-light emitting region NF at a high density. Further, the material that may be included in the photochromic layer 220 is not limited to the photochromic particles Ph, but may include particles of which the color may be changed corresponding to the incidence of external light including infrared rays (IR), X-rays, gamma rays, or microwaves, and the color-changed particles may absorb the external light to reduce (e.g., minimize) the external light reflection.

Further, the light blocking layer 230 may control the degree of color change of the photochromic layer 220 by absorption or reflection of the external light. The degree of the color change of the photochromic layer 220 may be individually controlled (e.g., discriminatingly controlled) according to the region of the photochromic layer 220. More specifically, the light blocking layer 230 may block the incident external light so that the degree of the color change of the first photochromic layer 221 that corresponds to (e.g., overlaps) the light emitting region EF is reduced (e.g., minimized).

The light blocking layer 230 may include a first light blocking layer 231 that corresponds to (e.g., overlaps) the light emitting region EF and a second light blocking layer 232 that corresponds to (e.g., overlaps) the non-light emitting region NF. As illustrated in FIG. 8, the first light blocking layer 231 may be in a matrix form, and may project or extend upward from an upper surface of the second light blocking layer 232. That is, the first light blocking layer 231 may be thicker than the second light blocking layer 232. Accordingly, the first light blocking layer 231 may absorb a larger quantity of the external light than the quantity of the external light absorbed by the second light blocking layer 232, and may partially or completely block the external light incident to the first photochromic layer 221. Further, in some embodiments, the external light reflection rate (e.g., the percentage of external light reflected) of the first light blocking layer 231 may be higher than the external light reflection rate of the second light blocking layer 232. Accordingly, the first light blocking layer 231 may absorb a larger quantity of the external light than the quantity of the external light absorbed by the second light blocking layer 232, and may partially or completely block the external light incident to the first photochromic layer 221.

Because the quantity of the external light can be mostly blocked by the first light blocking layer 231, the color of the first photochromic layer 221 may not be changed, or the degree of the color change may be reduced (e.g., minimized). However, because the second light blocking layer 232 blocks a smaller quantity of the external light, the color of the second photochromic layer 222 may be mostly changed by the external light. The color-changed second photochromic layer 222 can absorb the irradiated external light. Accordingly, the external light that is incident to the inside of the organic light emitting display device 20 can be partially or completely blocked by the second photochromic layer 222. As a result, the external light reflection is reduced, and the screen visibility can be improved. Further, the light emitted from the organic light emitting element EL may pass through the first photochromic layer 221, in a transparent state in which the color is not changed, without the light loss. Accordingly, the organic light emitting display device 20 according to this embodiment can prevent the deterioration of the light emitting efficiency due to the arrangement of the external light reflection prevention member while reducing (e.g., minimizing) the external light reflection, and thus the screen visibility and the display quality of the organic light emitting display device 20 can be improved.

In some embodiments, the first photochromic layer 221 may be thinner than the second photochromic layer 222. Accordingly, the distance in which the light emitted from the organic light emitting element EL passes through the first photochromic layer 221 can be reduced (e.g., minimized), and the loss of the light quantity that may occur when the light passes through the first photochromic layer 221 can be reduced (e.g., minimized). Accordingly, the reduction of the light emitting efficiency due to the arrangement of the photochromic layer 220 can be reduced (e.g., minimized).

In some embodiments, the organic light emitting display device 20 may further include a separate encapsulation substrate that encapsulates the substrate 210. The encapsulation substrate) may prevent the permeation of external materials into the element and may prevent the element from being damaged due to an external physical force. The encapsulation substrate may be a glass substrate or a thin-film encapsulation (TEE). The encapsulation substrate may be formed on the light blocking layer 230, but is not limited thereto. The encapsulation substrate may be arranged between the photochromic layer 220 and the substrate 210.

Further, in some embodiments, the organic light emitting display device 20 may further include a sensor that detects (e.g., senses) the degree of the color change of the photochromic layer 220. The sensor may be arranged between sealants, which correspond to overlapping portions between the substrate 210 and the encapsulation substrate, or pixels PX. The sensor may detect the degree of the color change of the photochromic layer 220 by detection of the external light quantity that permeates the photochromic layer 220. The sensor may output a voltage signal and/or a current signal that correspond to the sensed degree of the color change of the photochromic layer 220 to control the light emitting intensity of the organic light emitting element EL.

The explanation of other configurations of the organic light emitting display device is substantially the same as the explanation of the configurations of the organic light emitting display device 10 as explained above with reference to FIGS. 1 to 4, and thus may be omitted.

Hereinafter, still another embodiment of the present invention will be described. In the following embodiment, the same reference numerals are used for the same elements and configurations as the elements and configurations described above, and the duplicate explanation thereof may be omitted or simplified.

Figure 10:
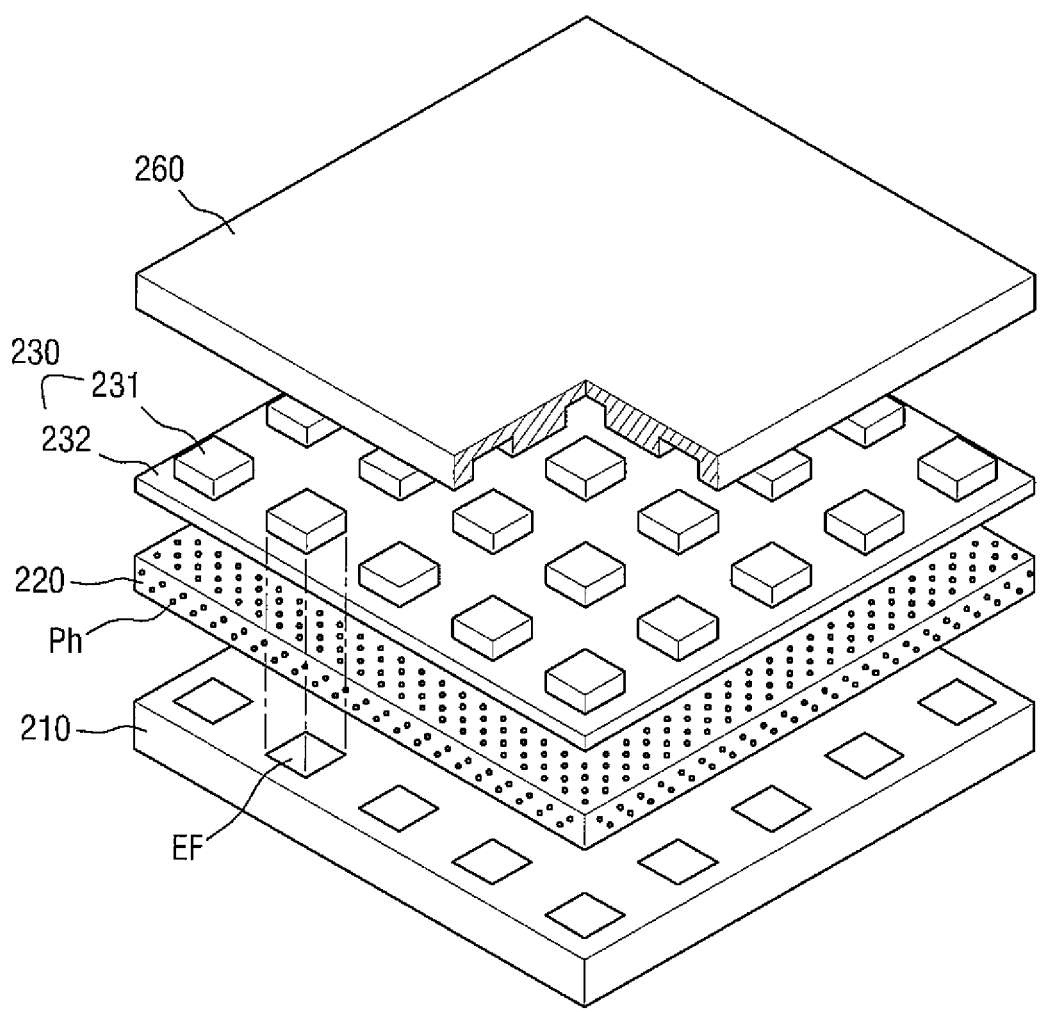
FIG. 10 is an exploded perspective view of an organic light emitting display device according to still another embodiment of the present invention.
Figure 11:
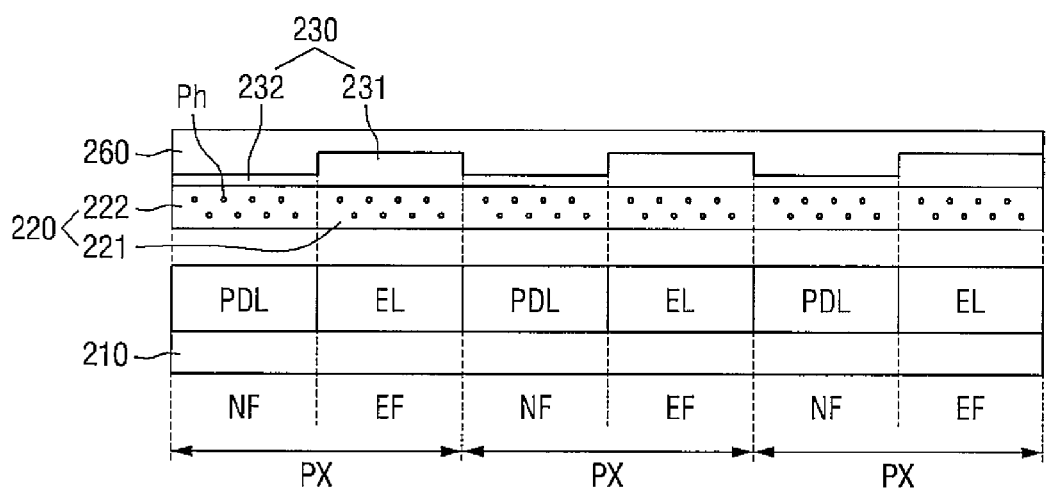
FIG. 11 is a cross-sectional view of an organic light emitting display device according to still another embodiment of the present invention.

FIG. 10 is an exploded perspective view of an organic light emitting display device according to still another embodiment of the present invention, and FIG. 11 is a cross-sectional view of an organic light emitting display device according to still another embodiment of the present invention.

Referring to FIGS. 10 and 11, an organic light emitting display device 21 may further include a reflection prevention layer 260 that is formed on the light blocking layer 230. The reflection prevention layer 260 may be formed on the whole surface of the light blocking layer 230. The reflection prevention layer 260 may be in the form of a single layer film having a refraction index that is different from the refraction index of the light blocking layer 230, and may be formed of polyethylene terephthalate (PET), triacetylcellulose (TAC), or polyvinyl alcohol (PVA), but is not limited thereto. In some embodiments, the reflection prevention layer 260 may have a multilayer structure in which low-refraction and high-refraction materials are alternately layered (e.g., laminated). The reflection prevention layer 260 may reduce or block the inflow of the external light into the organic light emitting display device 21 by changing the phase of the external light. That is, even in the case where the color change of the photochromic layer 220 does not occur, such as because the external light is not strong, the reflection prevention layer 260 may reduce (e.g., minimize) the external light reflection by reducing or blocking of the inflow of the external light. Accordingly, the organic light emitting display device 21 including the reflection prevention layer 260 can effectively reduce (e.g., minimize) the external light reflection and provide an improved screen visibility.

Hereinafter, still another embodiment of the present invention will be described. In the following embodiment, the same reference numerals are used for the same elements and configurations as the elements and configurations described above, and the duplicate explanation thereof may be omitted or simplified.

Figure 12:
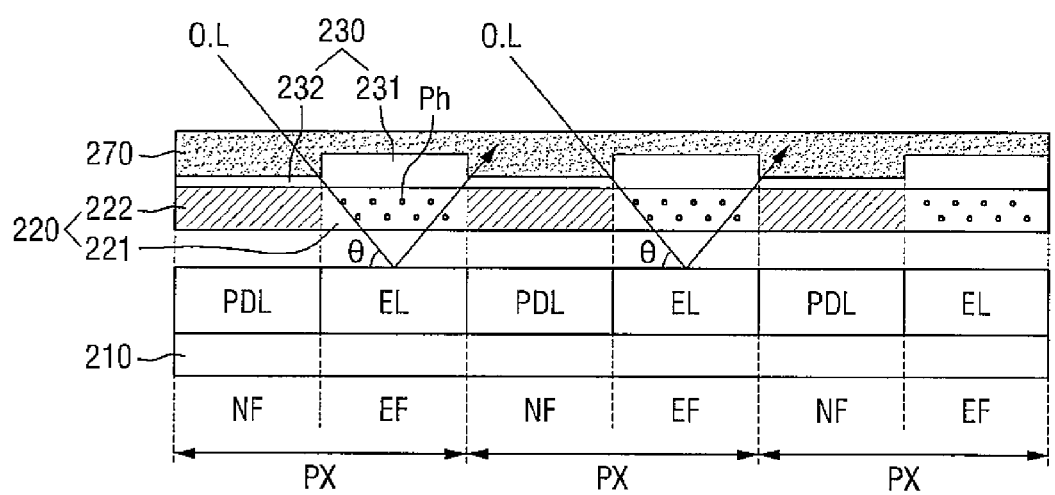
FIG. 12 is a cross-sectional view of an organic light emitting display device according to still another embodiment of the present invention.

FIG. 12 is a cross-sectional view of an organic light emitting display device according to still another embodiment of the present invention. Referring to FIG. 12, an organic light emitting display device 22 may further include a semi-permeation film 270 that is formed on the light blocking layer 230. The semi-permeation film 270 may be formed from a colloid including silver (Ag), gold (Au), or titanium (Ti), but is not limited thereto. The semi-permeation film 270 may be formed to include a photochromic material. A part of the light that is incident to the semi-permeation film 270 may be absorbed by or in the semi-permeation film 270, and another part of the light may pass through the semi-permeation film 270. That is, even in the case where the color change of the photochromic layer 220 does not occur, such as because the external light is not strong, the semi-permeation film 270 may reduce the external light reflection through effective reduction or blocking of the external light at a constant ratio.

Further, the semi-permeation film 170 may partially or completely absorb the external light OL that is not absorbed by the photochromic layer 220. That is, because the semi-permeation film 270 may absorb a part of the incident external light OL that passes through the first photochromic layer 222, when the color thereof is not changed, and a part of the emitted external light OL that passes through the first photochromic layer 222, the external light reflection that may be caused by the external light OL may be reduced (e.g., minimized). Accordingly, the semi-permeation film 270 can effectively reduce the external light reflection and provide an improved screen visibility.

Figure 13:
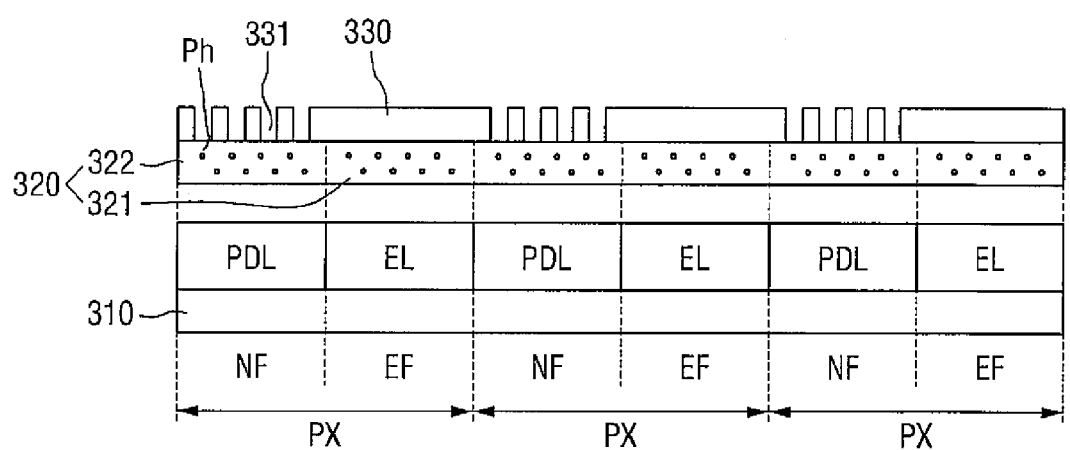
FIG. 13 is a cross-sectional view of an organic light emitting display device according to still another embodiment of the present invention.

Hereinafter, still another embodiment of the present invention will be described. FIG. 13 is a cross-sectional view of an organic light emitting display device according to still another embodiment of the present invention, FIG. 14 is an exploded perspective view of an organic light emitting display device according to still another embodiment of the present invention, and FIG. 15 is a cross-sectional view of an organic light emitting display device according to still another embodiment of the present invention.

Figure 14:
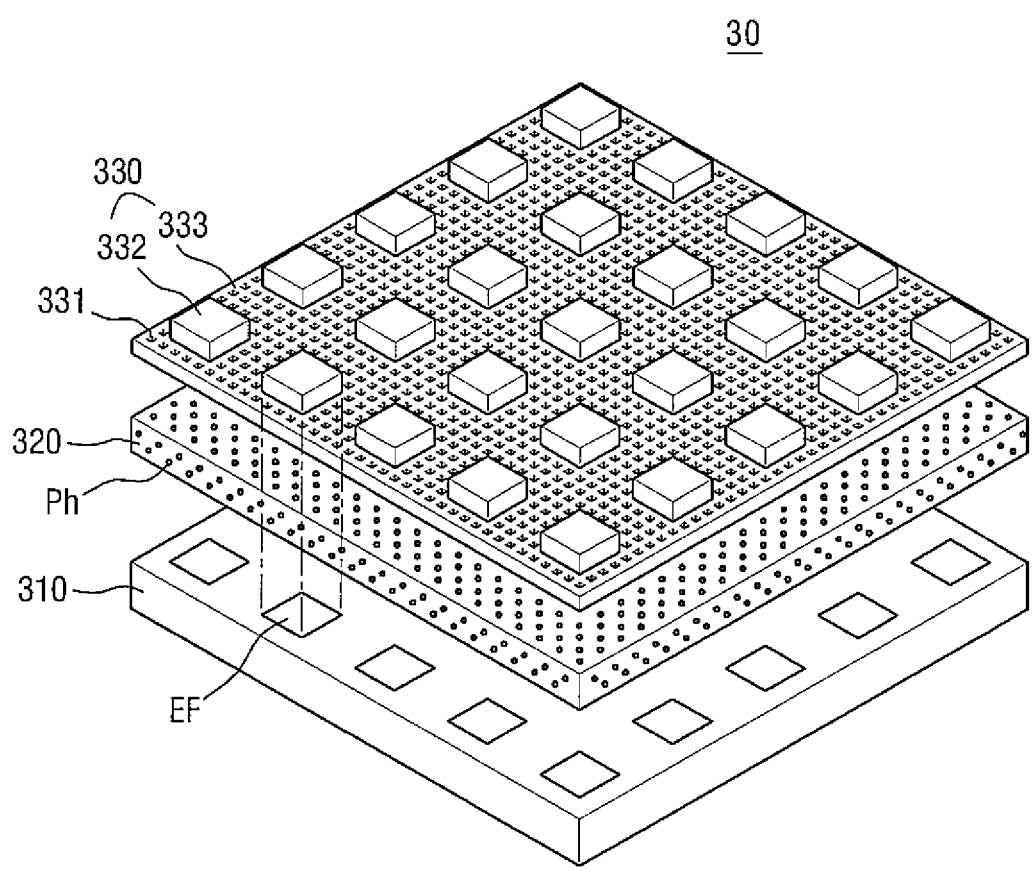
FIG. 14 is an exploded perspective view of an organic light emitting display device according to still another embodiment of the present invention.
Figure 15:
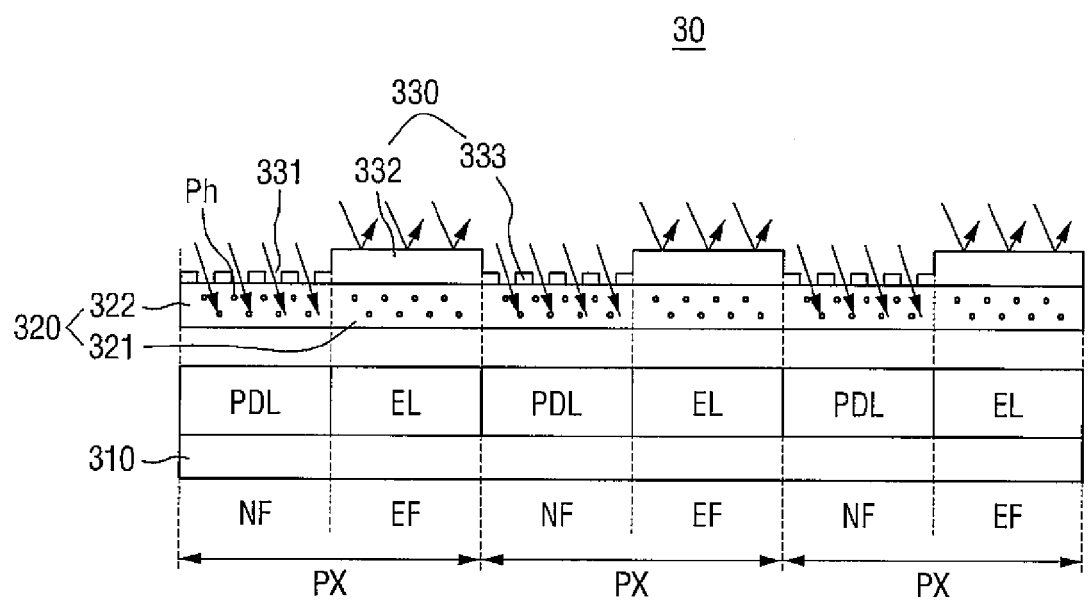
FIG. 15 is a cross-sectional view of an organic light emitting display device according to still another embodiment of the present invention.

Referring to FIGS. 13 to 15, an organic light emitting display device 30 includes a substrate 310, a photochromic layer 320, and a light blocking layer 330.

The substrate 310 may be formed of an insulating material. For example, the substrate 310 may be formed of glass, quartz, ceramic, or plastic. In some embodiments, the substrate 310 may be made of a material that is easily bent by an external force. The substrate 310 may include a plurality of pixels PX. Each pixel PX may include a non-light emitting region NF and a light emitting region EF. That is, the substrate 310 may include a plurality of non-light emitting regions NF and a plurality of light emitting regions EF, and the light emitting regions EF may be alternately arranged between the non-light emitting regions NF. Here, the light emitting region EF may correspond to a region in which an organic light emitting element EL is formed and light is emitted from the organic light emitting element EL. The non-light emitting region NF may correspond to a region in which a thin-film transistor TR that drives the organic light emitting element EL, a signal line, such as a gate line or a data line, or a pixel-defining film is formed.

The photochromic layer 320 may be formed in a path of the light that is emitted from the light emitting region EF. The photochromic layer 320 may be transparent with respect to a visible light, but its color is changed if a non-visible light, for example, ultraviolet rays, is irradiated thereon.

External light may include not only typical visible light but also ultraviolet rays. Accordingly, if external light that includes the ultraviolet rays is irradiated on the photochromic layer 320, the color of the photochromic layer 320 may be changed. The color-changed photochromic layer 320 may at least partly absorb the visible light included in the external light, and may reduce (e.g., prevent or minimize) an inflow of the external visible light to the organic light emitting display device 30. That is, the color-changed photochromic layer 320 can reduce (e.g., minimize) reflection of the external light and prevent the visibility from deteriorating. Further, if the ultraviolet rays are not or cease to be irradiated thereon, the photochromic layer 320 can return to the transparent state (e.g., become transparent with respect to the visible light). That is, because the photochromic layer 320 selectively exhibits reversible color-change properties depending on whether the external light is irradiated, the external light reflection can be effectively reduced (e.g., minimized), and the light emitting efficiency can be prevented from deteriorating.

In order to exhibit the above-described properties, the photochromic layer 320 may include photochromic particles Ph that correspond to a raw material of (e.g., a raw material capable of) ultraviolet (UV) color change. The photochromic particles Ph may be uniformly dispersed to the photochromic layer 320, or may be dispersed with different densities by region. For example, the photochromic particles Ph may be dispersed to a first photochromic layer 321 that corresponds to (e.g., overlaps) the light emitting region EF at a low density, and may be dispersed to a second photochromic layer 322 that corresponds to (e.g., overlaps) the non-light emitting region NF at a high density. Further, the material that may be included in the photochromic layer 320 is not limited to the photochromic particles Ph, but may include particles of which the color may be changed corresponding to external light including infrared rays (IR), X-rays, gamma rays, or microwaves, and the color-changed particles may absorb the external light to reduce (e.g., minimize) the external light reflection.

Because the light blocking layer 330 is formed in the light propagation path, it may be formed of a transparent material. The light blocking layer 330 may be formed on the whole surface of the photochromic layer 320. Accordingly, the light blocking layer 330 may partially or completely block a large quantity of the external light by absorption or reflection of the external light. Accordingly, the thin-film transistor TR or the organic light emitting element EL, which is formed on the substrate 310, can be prevented from being damaged due to the external light. As described above, the external light may be non-visible light, such as ultraviolet rays, but is not limited thereto. The light blocking layer 330 may partially or completely block the non-visible light, such as infrared rays (IR), X-rays, gamma rays, or microwaves.

Further, the light blocking layer 330 may include openings 331 for exposing an upper portion of the second photochromic layer 322. The openings 331 may be formed as a rectangular prism and may be arranged at intervals (e.g., predetermined intervals), but are not limited thereto. The external light may be incident to the second photochromic layer 322 through the openings 331. Accordingly, the color of the second photochromic layer 322 may be readily changed, and the color-changed second photochromic layer 322 may reduce (e.g., minimize) the external light reflection by absorption of the external light. Unlike the second photochromic layer 322, the first photochromic layer 321 can block most of the external light that passes through the light blocking layer 330 arranged on the upper portion thereof. Accordingly, the color of the first photochromic layer 321 may not be changed, or the degree of the color change may be reduced (e.g., minimized). The light emitted from the organic light emitting element EL may pass through the first photochromic layer 321, in a transparent state in which the color is not changed, without the light loss. Accordingly, the organic light emitting display device 30 according to this embodiment can prevent the deterioration of the light emitting efficiency due to the arrangement of the external light reflection prevention member while reducing (e.g., minimizing) the external light reflection, and thus the screen visibility and the display quality of the organic light emitting display device 30 can be improved.

As illustrated in FIGS. 14 and 15, the light blocking layer 330 may include a first light blocking layer 332 that corresponds to (e.g., overlaps) the light emitting region EF and a second light blocking layer 333 that corresponds to (e.g., overlaps) the non-light emitting region NF. Here, the second light blocking layer 333 may be thinner than the first photochromic layer 332. Accordingly, the external light can be incident to the second photochromic layer 322 through the openings, and thus the color of the second photochromic layer 322 can be readily changed.

In some embodiments, the photochromic layer 320 that corresponds to (e.g., overlaps) the light emitting region EF may be thinner than the photochromic layer 320 that corresponds to (e.g., overlaps) the non-light emitting region NF. Accordingly, the distance of the photochromic layer 320, through which the light emitted from the organic light emitting element EL passes, can be reduced (e.g., minimized), and the loss of the light quantity that may occur when the light passes through the photochromic layer 320 can be reduced (e.g., minimized). Accordingly, the reduction of the light emitting efficiency due to the arrangement of the photochromic layer 320 can be reduced (e.g., minimized).

Further, in some embodiments, the organic light emitting display device 30 may further include a reflection prevention layer that is formed on the light blocking layer 330. The reflection prevention layer may partially or completely block the inflow of the external light into the organic light emitting display device 30 by changing the phase of the external light. Accordingly, the reflection prevention layer can provide a high external light reflection rate and an improved screen visibility.

Further, in some embodiments, the organic light emitting display device 30 may further include a semi-permeation film that is formed on the light blocking layer 330. The semi-permeation film may be formed from a colloid including silver (Ag), gold (Au), or titanium (Ti), but is not limited thereto. The semi-permeation film may be formed to include a photochromic material. A part of the light that is incident to the semi-permeation film may be absorbed by or in the semi-permeation film, and another part thereof may pass through the semi-permeation film. The semi-permeation film may absorb a quantity (e.g., a predetermined quantity) of the reflected external light that passes through the first photochromic layer 322 at an angle (e.g., a predetermined angle). That is, because the semi-permeation film can reduce (e.g., minimize) the reflection of the external light that is not absorbed by the photochromic layer 320, the reduction effect of the external light reflection can be effectively provided, and an improved screen visibility can be provided.

In some embodiments, the organic light emitting display device 30 may further include a separate encapsulation substrate that encapsulates the substrate 310. The encapsulation substrate may prevent the permeation of external materials into the element and may prevent the element from being damaged due to an external physical force. The encapsulation substrate may be a glass substrate or a thin-film encapsulation (TFE). The encapsulation substrate may be formed on the light blocking layer 330, but is not limited thereto. The encapsulation substrate may be arranged between the photochromic layer 320 and the substrate 310.

Further, in some embodiments, the organic light emitting display device 30 may further include a sensor that detects (e.g., senses) the degree of the color change of the photochromic layer 320. The sensor may be arranged between sealants, which correspond to overlapping portions between the substrate 310 and the encapsulation substrate, or pixels PX. The sensor may detect the degree of the color change of the photochromic layer 320 by detection of the external light quantity that permeates the photochromic layer 320. The sensor may output a voltage signal and/or a current signal that correspond to the sensed degree of the color change of the photochromic layer 320 to control the light emitting intensity of the organic light emitting element EL.

The explanation of other configurations of the organic light emitting display device is substantially the same as the explanation of the configurations of the organic light emitting display device 10 as explained above with reference to FIGS. 1 to 4, and thus will be omitted.

Although example embodiments of the present invention have been described for illustrative purposes, those skilled in the art will appreciate that various modifications, additions and substitutions are possible, without departing from the scope and spirit of the invention as disclosed in the accompanying claims and their equivalents.

What is claimed is:

1. An organic light emitting display device comprising:
   a substrate having a non-light emitting region and a light emitting region;
   a photochromic layer in a path of light that is emitted from the light emitting region; and
   a light blocking layer on the photochromic layer,
   wherein the light blocking layer comprises a plurality of light blocking patterns that are spaced from each other, the light blocking patterns overlap the light emitting region, and a space between adjacent light blocking patterns exposes the non-light emitting region, and
   wherein the photochromic layer comprises a first photochromic layer that overlaps the light emitting region and a second photochromic layer that overlaps the non-light emitting region, and the first photochromic layer at the light emitting region is thinner than the second photochromic layer at the non-light emitting region.

2. The organic light emitting display device of claim 1, wherein the photochromic layer comprises photochromic particles, and
   the light blocking layer is configured to absorb or reflect ultraviolet rays.

3. The organic light emitting display device of claim 1, further comprising a reflection prevention layer on the light blocking layer.

4. The organic light emitting display device of claim 1, further comprising a semi-permeation film on the light blocking layer.

5. An organic light emitting display device comprising:
   a substrate having a non-light emitting region and a light emitting region;
   a photochromic layer in a path of light that is emitted from the light emitting region;
   a light blocking layer on the photochromic layer; and
   a semi-permeation film on the light blocking layer
   wherein the light blocking layer comprises a plurality of light blocking patterns that are spaced from each other, the light blocking patterns overlap the light emitting region, and a space between adjacent light blocking patterns exposes the non-light emitting region
   wherein the semi-permeation film comprises photochromic particles.

6. The organic light emitting display device of claim 1, further comprising a sensor configured to detect a degree of color change of the photochromic layer.

7. The organic light emitting display device of claim 1, further comprising an encapsulation member on the light blocking layer.

8. The organic light emitting display device of claim 1, further comprising an encapsulation member between the substrate and the photochromic layer.

9. An organic light emitting display device comprising:
   a substrate having a non-light emitting region and a plurality of light emitting regions, the non-light emitting region being between adjacent ones of the plurality of light emitting regions;
   a photochromic layer formed in a path of light that is emitted from each of the light emitting regions; and
   a light blocking layer on the photochromic layer,
   wherein the light blocking layer comprises a first light blocking layer that overlaps the light emitting regions and a second light blocking layer that overlaps the non-light emitting region, and the first light blocking layer is thicker than the second light blocking layer.

10. The organic light emitting display device of claim 9, wherein the photochromic layer comprises photochromic particles, and the light blocking layer is configured to absorb or reflect ultraviolet rays.

11. The organic light emitting display device of claim 9, wherein the photochromic layer comprises a first photochromic layer that overlaps the light emitting regions and a second photochromic layer that overlaps the non-light emitting region, and the first photochromic layer at the light emitting regions is thinner than the second photochromic layer at the non-light emitting region.

12. The organic light emitting display device of claim 9, further comprising a reflection prevention layer on the light blocking layer.

13. The organic light emitting display device of claim 9, further comprising a semi-permeation film on the light blocking layer.

14. An organic light emitting display device comprising:
a substrate having a non-light emitting region and a light emitting region;
a photochromic layer in a path of light that is emitted from the light emitting region; and
a light blocking layer on the photochromic layer,
wherein the photochromic layer comprises a first photochromic layer that overlaps the light emitting region and a second photochromic layer that overlaps the non-light emitting region, and the light blocking layer has openings exposing an upper portion of the second photochromic layer.

15. The organic light emitting display device of claim 14, wherein the photochromic layer comprises photochromic particles, and the light blocking layer is configured to absorb or reflect ultraviolet rays.

16. The organic light emitting display device of claim 14, wherein the light blocking layer comprises a first light blocking layer that overlaps the light emitting region and a second light blocking layer that overlaps the non-light emitting region, and the second light blocking layer is thinner than the first light blocking layer.

17. The organic light emitting display device of claim 14, wherein the photochromic layer comprises the first photochromic layer that overlaps the light emitting region and the second photochromic layer that overlaps the non-light emitting region, and the first photochromic layer at the light emitting region is thinner than the second photochromic layer at the non-light emitting region.

18. The organic light emitting display device of claim 14, further comprising a reflection prevention layer on the light blocking layer.

19. The organic light emitting display device of claim 14, further comprising a semi-permeation film on the light blocking layer.

* * * * *